(12) United States Patent
Rasmussen (10) Patent No.: US 6,540,898 B2
(45) Date of Patent: *Apr. 1, 2003

(54) METHOD AND SYSTEM FOR MANUFACTURE OF FIELD EMISSION DISPLAY

(75) Inventor: Robert T. Rasmussen, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/010,707

(22) Filed: Nov. 9, 2001

(65) Prior Publication Data

US 2002/0084186 A1 Jul. 4, 2002

Related U.S. Application Data (60) Continuation of application No. 09/231,864, filed on Jan. 14, 1999, now abandoned, which is a continuation of application No. 08/918,478, filed on Aug. 26, 1997, now abandoned, which is a division of application No. 08/589,039, filed on Jan. 19, 1996, now Pat. No. 5,762,773.

(51) Int. Cl.[7] .............................................. C25D 13/00
(52) U.S. Cl. ....................... 204/485; 204/486; 204/490; 430/311; 430/313
(58) Field of Search ................................ 204/485, 486, 204/490; 430/311, 313

(56) References Cited

U.S. PATENT DOCUMENTS

| | | | |
|---|---|---|---|
| 3,681,222 A | 8/1972 | Gupton, Jr. | 204/486 |
| 3,812,559 A | 5/1974 | Spindt et al. | 29/25.18 |
| 4,370,356 A | 1/1983 | Bok et al. | 427/38 |
| 4,891,110 A | 1/1990 | Libman et al. | 204/181.1 |
| 5,212,426 A | 5/1993 | Kane | 315/169.1 |
| 5,270,079 A | 12/1993 | Bok | 427/429 |
| 5,399,238 A | 3/1995 | Kumar | 156/643 |
| 5,582,703 A | 12/1996 | Sluzky et al. | 204/485 |
| 5,593,562 A | 1/1997 | Vickers | 204/486 |
| 5,601,966 A | 2/1997 | Kumar et al. | 430/313 |
| 5,762,773 A * | 6/1998 | Rasmussen | 204/485 |

OTHER PUBLICATIONS

Yokoo et al., "Active Control of Emission Current of Field Emitter Array," *Revue Le Vide, les Couches Minces* (Supplement No. 271): 58–61, Mar.–Apr., 1994.

Cathey, Jr., "Field Emission Displays," International Symposium of VLSI Technology Systems, and Applications, Proceedings of Technical Papers, May 31–Jun. 2, 1995, Taipei, Taiwan, 1995, pp. 131–136.

Lee, K.J. *Current Limiting of Fields Emitter Array Cathodes*, Georgia Institute of Technology Ph.D. Thesis, Aug., 1986, p. 162.

Curtain, C., "The Field Emission Display: A New Flat Panel Technology," Conference Record of the 1991 International Display Research Conference, Oct. 15–17, 1991, pp. 12–15.

* cited by examiner

*Primary Examiner*—Kishor Mayekar
(74) *Attorney, Agent, or Firm*—Dorsey & Whitney LLP (57) ABSTRACT

High resolution color displays for field emission displays are formed by applying a grille to a screen layer, the grille having a set of holes formed therein exposing areas of the screen layer. A layer of photoresist is applied to the grille and the exposed areas of the screen layer, whereby a plurality of photoresist-covered screen layer areas are defined. One set of the plurality of photoresist-covered screen layer areas is fixed, whereby a fixed set and an unfixed set are defined. The photoresist is removed from the unfixed set and a light emitting substance is deposited on the exposed screen layer area. The fixed set of photoresist is plasma etched.

8 Claims, 5 Drawing Sheets

METHOD AND SYSTEM FOR MANUFACTURE OF FIELD EMISSION DISPLAY

GOVERNMENT CONTRACT INFORMATION

This invention was made with Government support under Contract No. DABT63-93-C-0025 awarded by the Advanced Research Projects Agency (ARPA). The Government has certain rights in this invention.

CROSS-REFERENCE TO RELATED APPLICATIONS

This application is a continuation of U.S. patent application Ser. No. 09/231,864, filed Jan. 14, 1999, now abandoned, which is a continuation of U.S. patent application Ser. No. 08/918,478, filed Aug. 26, 1997, now abandoned, which is a divisional of U.S. patent application Ser. No. 08/589,039, filed Jan. 19, 1996, issued Jun. 9, 1998, as U.S. Pat. No. 5,762,773.

BACKGROUND OF THE INVENTION

This invention relates to the art of manufacture of field emission displays. In one specific application, the present invention relates to the fabrication of patterned phosphor screens for high resolution displays.

In the manufacture of field emission displays, photoresist masks are used, as described in, for example, U.S. Pat. No. 4,891,110, issued to Libman, et al., on Jan. 2, 1990, and listing Zenith Electronics Corporation as the assignee, which patent is incorporated herein by reference.

As described in Libman, the photoresist is fixed in certain areas over a conductive surface, the unfixed photoresist is then removed by a wash, such as water, and the exposed conductive surface is then subjected to a cataphoretic bath to apply a phosphor to the conductive surface. After that application, the fixed photoresist material must be removed, which is accomplished in the field emission display art by way of washing with, for example, a hydrogen peroxide solution Such washing causes mechanical agitation and dislodges particles of phosphor, resulting in unacceptable displays. This quality problem becomes even more critical as phosphor spot size or line width shrinks to achieve higher resolution products.

Accordingly, there is a need for a method and system for manufacture of field emission displays that will not mechanically agitate the phosphor during removal of photoresist material, and it is an object of the present invention to fill that need.

SUMMARY OF THE INVENTION

According to one embodiment of the present invention, a method is provided for producing high resolution displays, the method comprising: depositing an electrically conductive coating over a screening surface; shielding the electrically conductive coating with a grille having a set of holes formed therein exposing a set of areas of the electrically conductive coating; applying a layer of insulative photoresist to the grille and the exposed areas of electrically conductive coating, whereby a plurality of photoresist-covered conductive areas are defined; fixing one set of the plurality of photoresist-covered conductive areas, whereby a fixed set is defined, and an unfixed set is defined; removing the photoresist from the unfixed set; depositing a light emitting substance on the exposed-conductive area; and plasma etching the fixed set of insulative photoresist.

According to a further embodiment of the invention, a system for producing high resolution displays is also provided. The system comprising: depositor of an electrically conductive coating over a screening surface; depositor of a grille having a set of holes formed therein applied to the screening surface and exposing a set of areas of the electrically conductive coating; applicator of a layer of insulative photoresist to the grille and the exposed areas of electrically conductive coating, whereby a plurality of photoresist-covered conductive areas are defined; fixer of one set of the plurality of photoresist-covered conductive areas, whereby a fixed set is defined, and an unfixed set is defined; remover of the photoresist from the unfixed set; depositor of a light emitting substance on the exposed-conductive area; and plasma etcher of the fixed set of insulative photoresist.

DESCRIPTION OF THE DRAWINGS

For a more complete understanding of the present invention and for further advantages thereof, reference is made to the following Detailed Description taken in conjunction with the accompanying drawings, in which.

It is to be noted, however, that the appended drawings illustrate only typical embodiments of this invention and are therefore not to be considered limiting of its scope, for the invention may admit to other equally effective embodiments.

DETAILED DESCRIPTION

Figure 1:
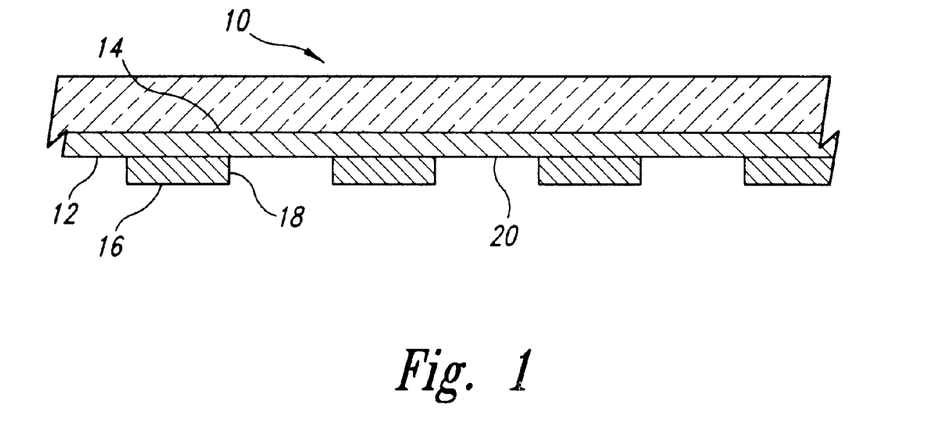
FIG. 1 is a sectional, side elevation, diagrammatic view of an embodiment of the present invention near the start of processing.

Referring now to FIG. 1, an embodiment of the present invention will be described in which a method for producing high resolution displays is provided. The method comprises forming a faceplate 10 by: depositing an electrically conductive coating 12 over a screening surface 14; shielding the electrically conductive coating 12 with a grille 16 having a set of holes 18 formed therein exposing a matrix of areas 20 on the electrically conductive coating 12. The grille is formed in much the same manner as the phosphor coating, namely, coating with a resist, soft baking, exposing, developing, and depositing the grille material. According to alternate embodiments, non-conductive coatings are used. Also, according to another embodiment, no such conductive layer is used, and a grille is applied directly to a screen. As used herein, the term "screen layer" defines either the screen or a layer applied to the screen, such as electrically conductive coating 12.

Figure 2:
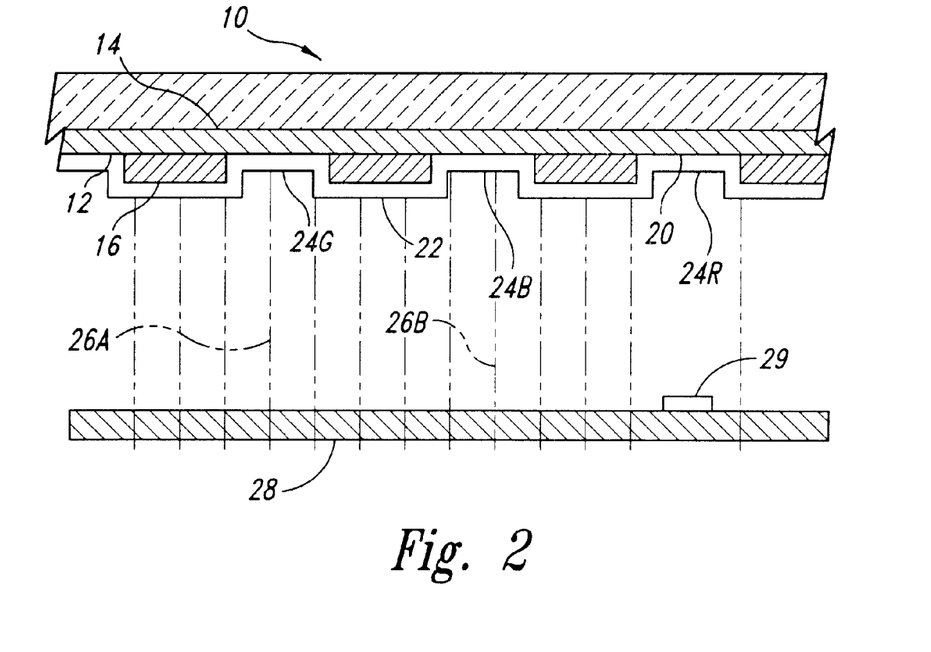
FIG. 2 is a sectional, side elevation, diagrammatic view of the embodiment of FIG. 1 at a further stage of processing.

Referring now to FIG. 2, the process further comprises applying a layer 22 of insulative photoresist to the grille 16 and the areas 20 of electrically conductive coating 12 exposed by the grille; fixing sets of areas 24G and 24B of photoresist-covered areas, whereby fixed sets of area 24G and 24B and an unfixed set of areas 24R are defined. According to the embodiment shown, the fixing is accomplished by shining ultraviolet light 26 though a mask 28, which is similar to a semiconductor lithography mask. These masks are made of quartz (or glass) and have opaque layer 29 on them (such as chrome oxide or black chrome) to set a pattern, as is known to those skilled in the art. Alternative methods of fixing include the use of a positive photoresist, where the fixing comprises application of the photoresist and light is applied to the areas where it is desired that the photoresist be unfixed.

Figure 3:
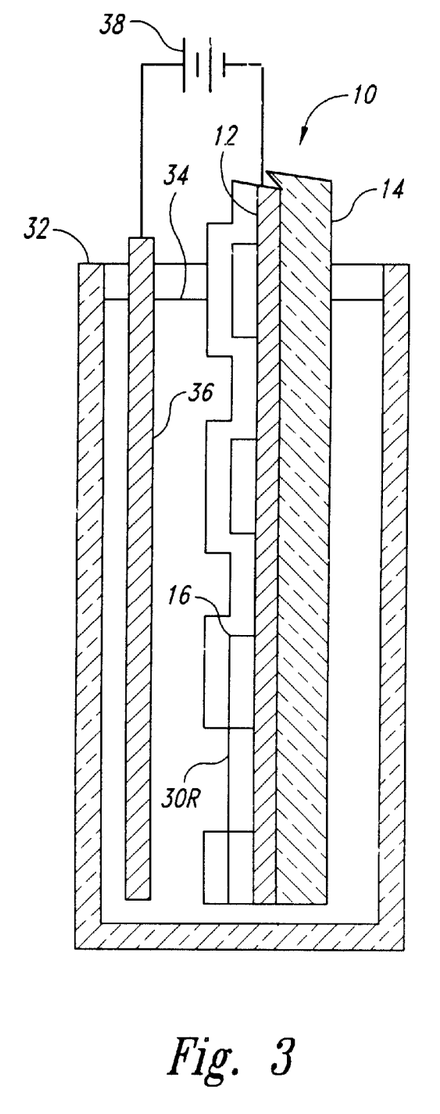
FIG. 3 is a sectional, side elevation, diagrammatic view of a cataphoretic deposition device useful according to one example embodiment of the present invention.

Referring now to FIG. 3, the process further comprises removing the photoresist from the unfixed set; and depositing a light emitting substance 30R on the exposed-conductive area. According to one embodiment, the depositing is accomplished through cataphoretic deposition as known to those of skill in the art. The illustrated tank 32 is filled with an appropriate electrolyte 34 and contains an electrode 36 connected to a power supply 38, which is also connected to the electrode of the faceplate 10.

According to a more specific embodiment, the light emitting substance 30R comprises a phosphor, having the following characteristics:

Zinc silicate: manganese
Zinc sulphide: copper
Zinc beryllium silicate: manganese
Zinc sulphide: silver and Zinc cadmium sulphide: silver
Calcium tungstate
Zinc sulphide: silver and Zinc cadmium sulphide: copper
Calcium pyrophosphate
Potassium chloride (Dark trace—nonluminescent—called a Scotophor)
Zinc sulphide: silver
Zinc magnesium fluoride: manganese
Magnesium silicate: manganese
Zinc oxide
Calcium magnesium silicate: cerium
Zinc oxide and Zinc cadmium sulphide: copper
Calcium magnesium silicate: titanium and Calcium beryllium silicate: manganese
Potassium magnesium fluoride: manganese
Zinc cadmium sulphide: silver
Magnesium fluoride: manganese
Zinc sulphide: silver, Zinc silicate: manganese, Zinc phosphate: manganese
Zinc sulphide: silver, Zinc cadmium sulphide: cadmium sulphide: silver
Zinc sulphide: silver, Zinc cadmium sulphide: vanadate: europium
Zinc sulphide: silver, Zinc cadmium sulphide: oxysulphide: europium
Zinc sulphide: silver, Zinc cadmium sulphide: oxide: europium
Zinc sulphide: silver, Zinc cadmium sulphide: copper, Yttrium oxysulphide: europium
Zinc oxide
Calcium silicate: lead: manganese
Zinc phosphate: manganese
Zinc cadmium sulphide: copper
Zinc sulphide: copper
Calcium magnesium silicate: titanium Zinc cadmium sulphide: copper
Magnesium fluoride: manganese
Zinc sulphide: lead: copper
Zinc sulphide selenide: silver
Zinc sulphide: silver: nickel
Zinc cadmium sulphide: silver: nickel
Zinc magnesium fluoride: manganese
Zinc silicate: manganese: arsenic
Zinc sulphide: silver Zinc cadmium sulphide: copper
Zinc magnesium fluoride: manganese Calcium Magnesium silicate: cerium
Zinc sulphide: copper: Zinc silicate: manganese: arsenic
Gadolinium oxysulphide: terbium
Lanthanum oxysulphide: terbium
Yttrium oxysulphide: terbium
Yttrium aluminate: cerium
Yttrium silicate: cerium
Penetron phosphor—yttrium vanadate: europium (Red) (10 KeV) Zinc silicate: manganese (Green) (17 keV)
Penetron phosphor—Red @ 8 keV/Green @ 15 keV
Penetron phosphor—Red @ 6 keV/Green @ 12 keV
Zinc silicate: titanium
Yttrium gallium aluminum garnet: terbium
Yttrium oxyeulphide: terbium Zinc cadmium sulphide: copper
Zinc sulphide: silver
yttrium oxide: europium It is fully within the scope of the present invention to apply a binder material to the substrate in order to firmly attach the phosphor and grille material to the substrate. A suitable binder would be a 1% by wt solution of an organo-silicate, such as Techniglas GR650F, in isopropanol or other suitable solvent. This could be applied by a puddle or spray application, or other suitable method, with the substrate then being spun dry at approximately 1000 RPM.

It would also be within the scope of the invention to eliminate the organics from the screen, and the binder, by a baking operation. If the organics are not baked out, then there may be problems with carbon contamination which could adversely affect the future performance of the phosphor. The preferred baking would be done in a suitable oven ramped to 650–700° C. at a rate the substrate can handle without breaking. The parts need be held at temperature for only about 30 minutes before cooling and removing them from the oven.

Figure 4:
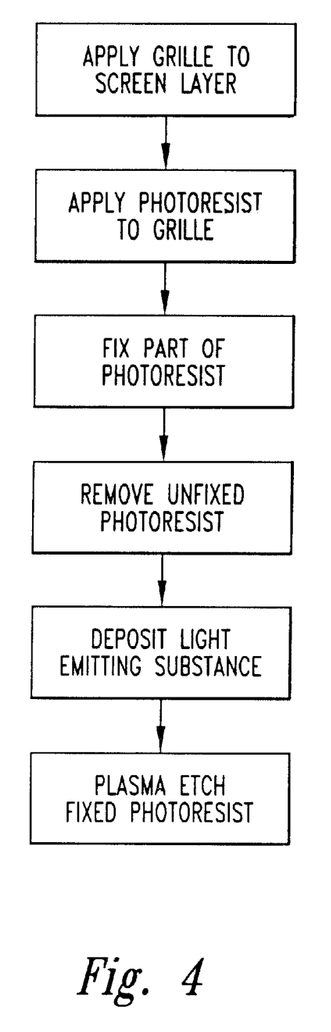
FIG. 4 is a flow chart of a process provided according to one aspect of the present invention.
Figure 5A:
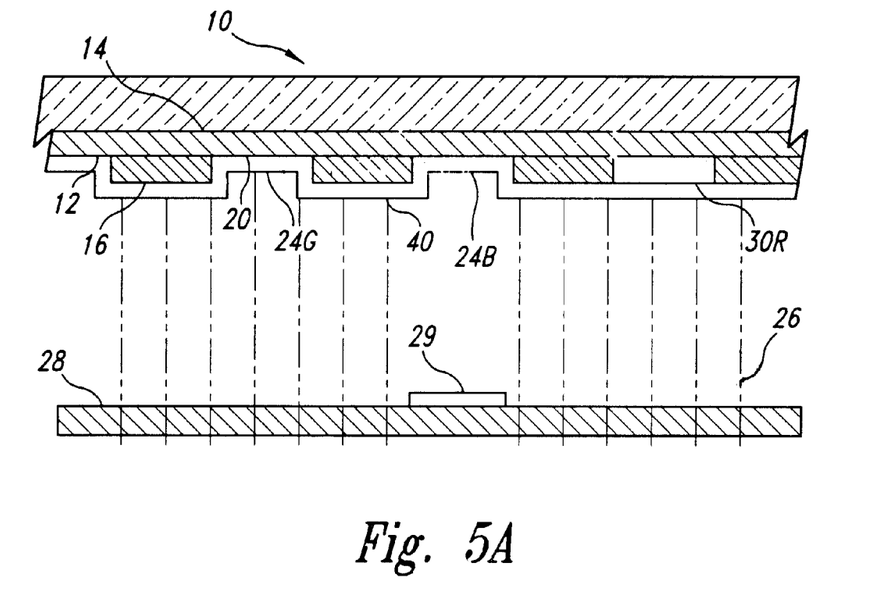
FIGS. 5A and 5B are sectional, side elevation, diagrammatic views of the embodiment of the present invention in a still further stage of processing.
Figure 5B:
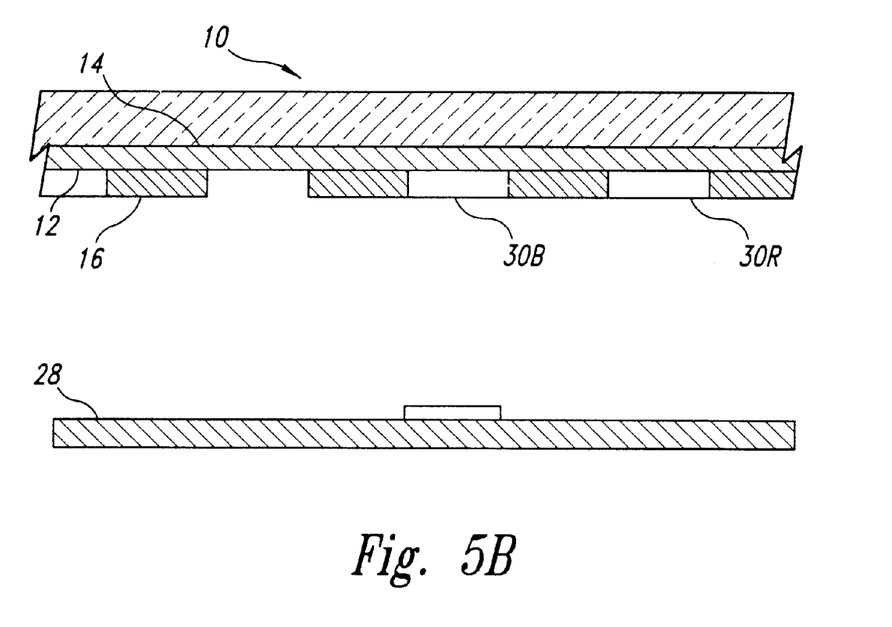

Referring now to FIG. 4, which shows the process flow in block diagram form, the process further comprises plasma etching the fixed set 24G and 24B of insulative photoresist. Examples of acceptable etchers include either barrel type or parallel plate etchers, as are known by those skilled in the art Referring now to FIGS. 5A and 5B, the method further comprises applying a layer 40 of insulative photoresist (for example, an OCG SC series photoresist) to the entire substrate and fixing the photoresist in all areas except 24B of the insulative photoresist covering the exposed-conductive area 20. Using, for example, a gentle wash with developer appropriate for photoresist, the unfixed portion of the insulating photoresist covering is then removed, and a second color light emitting substance 30B is deposited on the exposed-conductive area, as discussed above with respect to the first color light emitting substance. Acceptable examples for applying layer 40 comprise: meniscus coating, spin coating, curtain coating, and other methods that will occur to those skilled in the art. It is believed that another acceptable example comprises cataphoretic deposition. Phosphors useful with various means of application will be understood by those of skill in the art from the present description.

Figure 6A:
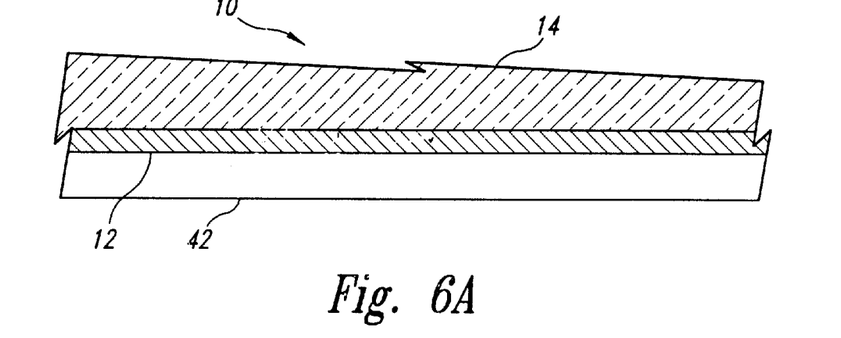
FIGS. 6A to 6C are sectional, side elevation, diagrammatic views of an embodiment of the present invention for forming the grille.
Figure 6B:
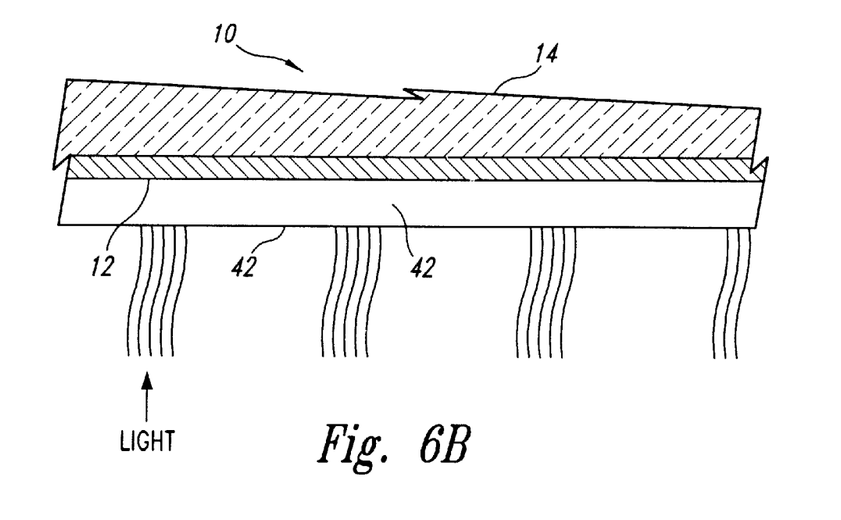
Figure 6C:
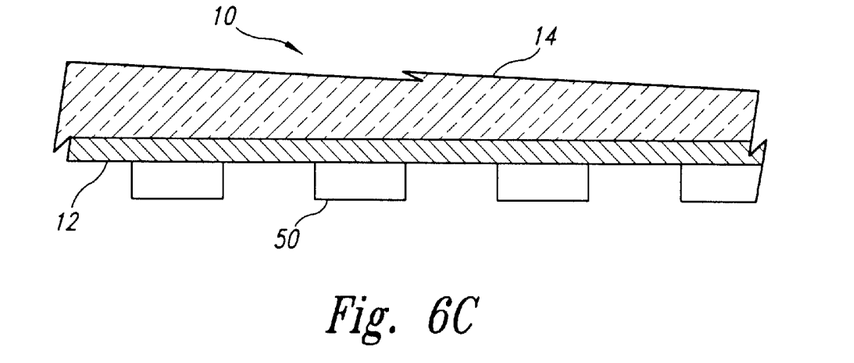

Referring now to FIGS. 6A–6C, an acceptable method for forming grilles, having a patterned array of holes therein, will be described. According to this method, the forming comprises: applying a layer 42 of insulative photoresist to the electrically conductive coating 12; fixing one set 44 of photoresist-covered conductive areas; and removing the unfixed photoresist with, for example, a gentle wash with developer appropriate for the photoresist used (for example, Waycoat Negative Photoresist Developer for SC resists made by OCG).

Figure 7:
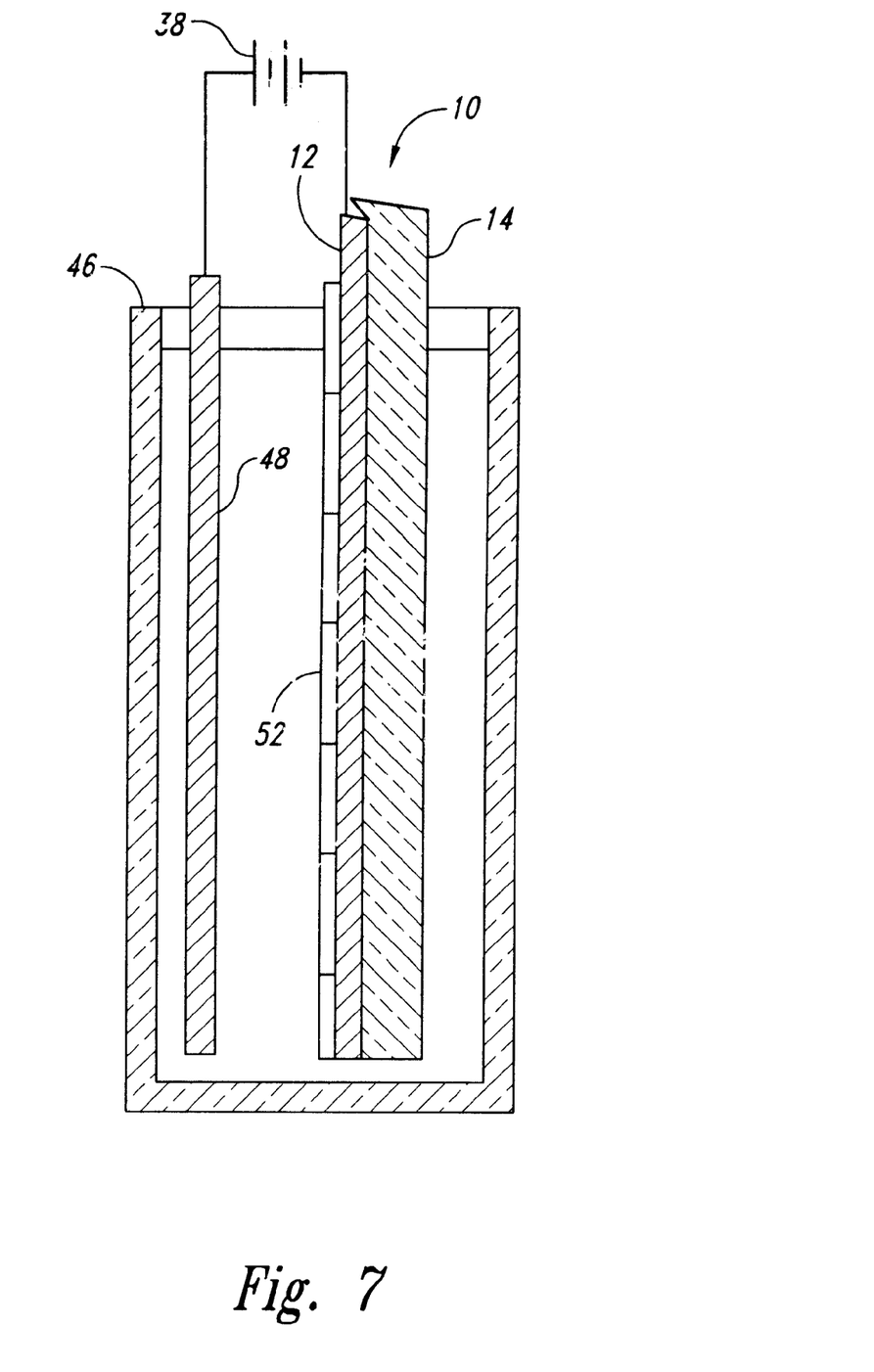
FIG. 7 is a sectional, side elevation, diagrammatic view of another cataphoretic deposition device useful with the embodiment of the FIGS. 6A to 6C.

Referring now to FIG. 7, the faceplate 10 is subjected to a cataphoretic bath 46, wherein a potential is developed between the conductive coating 12 and electrode 48, which comprises, in this example, stainless steel. As a result, the grille 52 forms on the conductive surface 12 where the unfixed photoresist was removed. The fluid used in the cataphoretic bath 46 comprises, for example, about 99.7% by weight of vehicle (for example, isopropyl alcohol) no more than 0.02% by weight electrolyte (for example, lanthanum nitrate hexahydrate), about 0.05 to 0.10% by weight Glycerol, and a powder phosphor or a light-absorbing material. Acceptable examples include: manganese carbonate, cobalt oxide black, and iron oxides mixed with cobalt oxides. Up to 1% water can be added to the phosphor or light absorbing material.

Other grille materials believed to be useful with the present invention include: boron carbide, lead (IV) oxide, niobium (HI) oxide, niobium (IV) oxide, palladium (II) oxide, rhenium (IV) oxide, tungsten carbide, silicon carbide, vanadium carbide, copper oxide, boron silicide, chrome (II) oxide, germanium oxide, iridium oxide, titanium oxide, manganese carbide, manganese phosphide, manganese tantalate, osmium oxide, strontium boride, strontium carbide, thorium silicide, molybdenum (II) oxide, molybdenum (III) oxide, molybdenum sulfide, and praseodymium manganese oxide.

The voltage applied according to this embodiment is between about 100 volts and about 200 volts, with a current at about $0.01 \times 10^{-3}$ amperes per square centimeter. And the specific resistance of the bath is between about $5 \times 10^5$ and about $1.0 \times 10^6$ ohms per centimeter. The application of insulative grilles in the above-described manner provides for holes in the fixed set of photoresist-covered conductive areas.

Next photoresist is then removed by plasma etching, conducted as is known to those of skill in the art. However, according to some specific embodiments of the invention, the photoresist used should be chosen from a group that does not leave a residual ash after plasma etching. The following are believed or known to be acceptable: polyisoprene based photoresists, polyvinyl alcohol based photoresists, some polyimide based resists and some negative chemically amplified resists.

During the plasma etching, it is acceptable to use a pressure of about 1 Torr, power of between about 400 to about 500 watts, in a gas atmosphere of: air, oxygen/nitrogen mixture, or any other suitable gases for stripping the photoresist. Other examples known or believed to be effective include oxygen and hydrogen/argon mixtures.

Process time during the etch is, according to some embodiments, about 30 minutes, but this time varies depending upon etch process parameters and the particular photoresist used. It will be recognized that changes may be made in the above-described example embodiments without departing from the spirit and scope of the present invention.

The present invention may be subject to many modifications and changes without departing from the spirit or characteristics thereof. The present disclosure is therefore intended in all respects as being illustrative and not restrictive as to the scope of the present invention as defined by the appended claims.

I claim:

1. A method for producing a high resolution display having a screen surface, comprising:

depositing an electrically conductive coating over the screen surface;

shielding the electrically conductive coating by disposing a grille on the electrically conductive coating, the grille having a plurality of holes that expose predetermined areas of the conductive coating;

disposing a layer of photo-resist to the grille and the exposed areas of the conductive coating;

fixing the photo-resist covered exposed areas to define a plurality of fixed areas and unfixed areas;

stripping the photoresist from the unfixed areas to define a plurality of patterned areas;

applying a light emitting substance onto the patterned areas; and plasma etching the plurality of fixed areas to remove the photo-resist.

2. The method according to claim 1, wherein disposing is further comprised of disposing a first layer of photo-resist, fixing is further comprised of defining a first plurality of fixed areas and a first plurality of unfixed areas, stripping is further comprised of defining a first plurality of patterned areas, applying is further comprised of applying a first light emitting substance onto the first patterned areas, and plasma etching is further comprised of plasma etching the first plurality of fixed areas to define a substrate surface comprised of the grille, the first patterned areas, and the predetermined areas of the conductive coating, and further wherein the method comprises:

disposing a second layer of photo-resist to the substrate;

fixing the second layer of photo-resist to define a plurality of second fixed areas and a plurality of second unfixed areas;

stripping the second layer of photo-resist from the plurality of second unfixed areas to define a plurality of second patterned areas;

applying a second light emitting substance onto the plurality of second patterned areas; and plasma etching the plurality of second fixed areas.

3. The method according to claim 1, wherein fixing is further comprised of illuminating the photo-resist covered exposed areas by transmitting light through a mask.

4. The method according to claim 3, wherein fixing is further comprised of:

activating a light source to emit light; and passing the emitted light through the mask to illuminate the photo-resist covered exposed areas.

5. The method according to claim 4, wherein illuminating the photo-resist covered exposed areas is further comprised of illuminating the photo-resist covered exposed areas with ultraviolet light.

6. The method according to claim 1, wherein stripping the photoresist from the unfixed areas further comprises rinsing the screen surface with a developer.

7. The method according to claim 1, wherein depositing a light emitting substance onto the patterned areas further comprises depositing the substance onto the patterned areas with a cataphoretic bath.

8. The method according to claim 1, wherein depositing a light emitting substance onto the patterned areas further comprises depositing a phosphor compound onto the patterned areas.

* * * * *

UNITED STATES PATENT AND TRADEMARK OFFICE
CERTIFICATE OF CORRECTION

PATENT NO. : 6,540,898 B2
DATED : April 1, 2003
INVENTOR(S) : Robert T. Rasmussen It is certified that error appears in the above-identified patent and that said Letters Patent is hereby corrected as shown below:

Column 5,
Line 34, "niobium (HI) oxide," should read -- niobium (II) oxide, --

Signed and Sealed this

Thirtieth Day of March, 2004

JON W. DUDAS
*Acting Director of the United States Patent and Trademark Office*